United States Patent [19]

Bares et al.

[11] Patent Number: 4,721,923

[45] Date of Patent: Jan. 26, 1988

[54] RADIO RECEIVER SPEECH AMPLIFIER CIRCUIT

[75] Inventors: Jaromir R. Bares, Lighthouse Point; Bakulesh B. Patel, Coral Springs, both of Fla.; James H. Stangel, Wiesbaden, Fed. Rep. of Germany

[73] Assignee: Motorola, Inc., Schaumburg, Ill.

[21] Appl. No.: 923

[22] Filed: Jan. 7, 1987

[51] Int. Cl.$^4$ .............................................. H03G 3/18
[52] U.S. Cl. ..................................... 330/284; 330/144
[58] Field of Search ............... 330/129, 130, 144, 278, 330/279, 284; 381/120; 455/230, 231, 232, 233, 234

[56] References Cited

U.S. PATENT DOCUMENTS 4,147,991  4/1979  Ijichi et al. ........................... 330/284
4,276,604  6/1981  Kitamura et al. ................. 330/144 X

FOREIGN PATENT DOCUMENTS 2400804  7/1975  Fed. Rep. of Germany ...... 330/144
0037351  4/1978  Japan .................................. 330/284

OTHER PUBLICATIONS

Niederjohn, Russell J. and James H. Grotelueschen, "The Enhancement of Speech Intelligibility in High Noise Levels by High-Pass Filtering Followed by Rapid Amplitude Compression", IEEE Transactions on Acoustics, Speech, and Signal Processing, vol. ASSP-24, No. 4, Aug. 1976, pp. 277-282.

Primary Examiner—Eugene R. LaRoche
Assistant Examiner—Steven J. Mottola
Attorney, Agent, or Firm—Martin J. McKinley; Joseph T. Downey; Mark P. Kahler

[57] ABSTRACT

A speech amplifier circuit increases the maximum perceived loudness at the speaker (412) and reduces distortion at high volume levels without increasing the power consumed by the speech powder amplifier (410). When a low volume is selected by the volume control (414), the microcomputer (418) sets the step attenuator (406) at a correspondingly high attenuation level and the high-pass filter (408) is bypassed. As the volume control (414) is advanced and the speech power amplifier (410) is 12 dB into clipping, the microcomputer (418) activates the high-pass filter (408) and simultaneously steps the gain of the step attenuator (406) by 6 dB.

2 Claims, 6 Drawing Figures

ROTATION ANGLE OF VOLUME CONTROL

RADIO RECEIVER SPEECH AMPLIFIER CIRCUIT

BACKGROUND OF THE INVENTION

This invention relates to the field of speech amplifier circuits for battery powered radio receivers and more particularly to a circuit that reduces speech distortion and increases perceived loudness.

In the design of radio frequency receivers for the reception of voice transmissions, it is desirable to include a speech amplifier that can be adjusted to provide as much distortion free power output to the speaker as the listener may require. But, most amplifiers operate more efficiently near clipping and, for a given power output, an amplifier with a smaller maximum power output capability than another similarly designed amplifier will typically require less power input. Consequently, when the radio receiver is battery powered, it becomes desirable to limit maximum amplifier power capability to reduce battery drain and extend the time between battery charges or replacement. These two design goals are obviously in conflict and a compromise maximum power output capability is usually chosen for the speech amplifier when the radio receiver is battery powered.

In FIG. 1, a prior art radio receiver is illustrated. Referring to this figure, the demodulated speech output of a receiver "front end" 102 is coupled by a potentiometer 104 to a speech amplifier 106 and speaker 108. Potentiometer 104 functions as a volume control (a rotary control is assumed) and at some point in its rotation, the input signal to speech amplifier 106 will be sufficient to drive the amplifier into clip. This is graphically illustrated in FIGS. 2a, b and c wherein the thin and thick lines respectively represent the response of the prior art circuit of FIG. 1 and the response of the present invention of FIG. 4 (described below). In FIGS. 2a, b and c respectively, the gain of volume control 104, the perceived loudness to the listener, and the amplifier distortion are plotted against the rotation angle of the volume control.

As the volume control is advanced from its minimum volume position (the far left on the horizontal axis of the graphs) amplifier 106 begins to clip at rotation angle 202. FIG. 2a indicates that the amplifier input signal increases as the volume control is rotated beyond point 202 (to the right on the horizontal axis of the graphs); yet, FIGS. 2b and 2c respectively show that there is no substantial increase in the perceived volume and that the distortion increases rapidly as the volume control is rotated beyond point 202.

The amplifier clipping can best be understood by referring to FIG. 3 wherein a frequency response plot of a typical human voice is illustrated. The typical human voice has first, second and third peaks or "formants" 302, 304 and 306 centered approximately at 700, 1500 and 2400 Hz. The first formant can be as much as 15 dB stronger than the second, and the second formant can be as much as 6 dB stronger than the third.

When speech amplifier 106 begins to clip, frequencies within the band width of first formant 302 are distorted before those of second formant 304 and third formant 306. Unfortunately, additional distortion occurs because the second and third harmonic products of the first formant fall within the bandwidth of the second and third formants. Thus, distortion increases rapidly and there is no significant increase in the perceived loudness at the speaker once distortion begins. Accordingly, it would be desirable if the speech signal could be conditioned before amplification to reduce this distortion and increase the perceived loudness, while simultaneously maintaining intelligibility.

SUMMARY OF THE INVENTION

Briefly, the invention is a speech amplifier for a battery powered radio receiver that includes variable gain means for varying the amplitude of an electrical speech signal. The variable gain means includes a control input for selecting the amplitude of the electrical speech signal. A high pass filter is coupled to the variable gain means. The high pass filter has active and bypass modes, and a control input for selecting one of these modes. A speech amplifier is coupled to the filter and a speaker is then coupled to the amplifier. A volume selecting means is provided for selecting the volume speech emitted from the speaker. A controlling means for controlling the variable gain means and the filter is coupled to the volume selecting means. The active mode of the filter is selected by the controlling means when the volume selecting means is advanced to a predetermined level and, simultaneously, the variable gain means is adjusted by the controlling means to have a step increase in the amplitude of the electrical speech signal.

In another embodiment of the invention, the high pass filter has a corner frequency of substantially 1.1 KHz and the step increase in the amplitude of the electrical speech signal is substantially 6 dB.

DESCRIPTION OF THE PREFERRED EMBODIMENT

Figure 4:
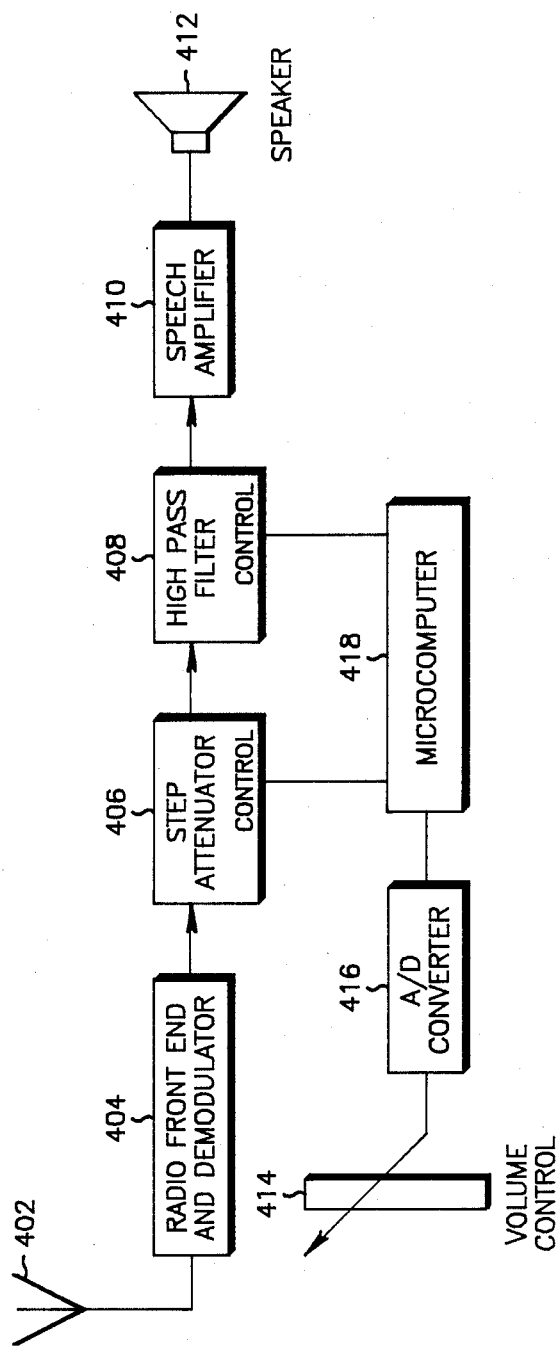
FIG. 4 is a block diagram of the present invention.

In FIG. 4 a block diagram of the present invention is illustrated. Referring to this figure, an antenna 402 is connected to the "front end" of a well known radio frequency receiver 404. Radio front end 404 includes a demodulator, the output of which is connected to the input of a step attenuator 406. Step attenuator 406 preferably has 250 steps wherein each step is 0.25 dB. Step attenuator 406 has a control input for selecting one of the 250 steps of attenuation. The output of step attenuator 406 is connected to the input of a high pass filter 408. High pass filter 408 has "active" and "bypass" modes which are selected by a control input. In the active mode, filter 408 functions as a two pole high pass filter with a corner frequency of 1.1 KHz. In the bypass mode, however, no filtering is provided and the input is essentially coupled to the output. The output of filter 408 is connected to the input of a speech amplifier 410 and the output of the speech amplifier is connected to a speaker 412.

In the preferred embodiment, a four section bi-quad switched capacitor filter is connected between the output of attenuator 406 and the input of speech amplifier 410. One section of the switched capacitor filter functions as high pass filter 408, while the other three sections function as high pass filters with a corner frequency of 300 Hz. In this particular application, control signals, such as a well known "tone coded squelch" signal, are transmitted in the frequency band between DC and 300 Hz. The three sections with the 300 Hz corner frequency filter out these control signals to prevent them from being amplified by speech amplifier 410. In the preferred embodiment, to enter the bypass mode, the frequency of high pass filter 408 is merely shifted from 1.1 KHz down to 300 Hz, thereby providing further attenuation for the subaudible control signals. The change in the corner frequency of high pass filter 408 from 1.1 KHz to 300 Hz is accomplished by changing the clock frequency at the control input of filter 408. Although a switched capacitor filter provides a convenient way of controlling the mode of the filter, other well known filter types are also suitable.

A linear taper rotory potentiometer 414 has one end-terminal connected to ground and the other connected to a source of positive voltage. The wiper-terminal of potentiometer 414 is connected to the input of an analog-to-digital converter 416. The number of bits in A/D converter 416 determines the number of steps that can be selected in attenuator 406 and, in the preferred embodiment, it has 8 bits. The output of A/D converter 416 is connected to an input port of a microcomputer 418.

Microcomputer 418 is preferably a low power CMOS 8 bit microcomputer and in the preferred embodiment a Motorola MC1468HC11 microcomputer is used. One output port of microcomputer 418 is connected to the control input of attenuator 406 while another output is connected to the control input of high pass filter 408. Microcomputer 418 contains well known "look up" table software that selects, based on the rotation angle of volume control 414, a particular attenuation for attenuator 406 and a particular mode for filter 408. More particularly, the microcomputer reads the rotation angle of the volume control (actually, the binary output of the A/D converter which corresponds directly to the rotation angle), looks up the corresponding step attenuator setting and filter mode in the table, and then sets the attenuator and filter accordingly. Mathematically, the look-up table for the attenuator descretely emulates the thick curve of FIG. 2a. For the filter, the look-up table simple activates the filter above rotation angle 202 and bypasses the filter below that angle, as illustarted in FIG. 2a.

In operation, step attenuator 406 provides a variable gain means for varying the amplitude of the electrical speech signal that appears at the demodulator output of radio front end 404. Microcomputer 418 provides a controlling means for controlling the gain of attenuator 406 and the mode of filter 408. Potentiometer 414 provides a volume selecting means for selecting the volume of speech emitted from the speaker as a function of the rotation of the potentiometer.

When a low volume is selected by appropriate rotation of volume control 414, the analog voltage that appears on the wiper of potentiometer 414 is converted to an 8 bit digital signal by A/D converter 416 and then coupled to microcomputer 418. Microcomputer 418 sends an appropriate control signal to step attenuator 406 wherein the gain will be set at a predetermined level. For low volumes, microcomputer 418 places filter 408 in the bypass mode wherein the output of attenuator 406 is essentially coupled directly to the input of speech amplifier 410.

When volume control 414 is advanced slightly, the output of A/D converter 416 is incremented and microcomputer 418 correspondingly sends the new control signal to step attenuator 406 to increase the gain by approximately 0.25 dB. Thus, as volume control 414 is advanced, microcomputer 418 correspondingly increases the gain of step attenuator 406. Eventually, the gain of step attenuator 406 will be sufficiently large such that speech amplifier 410 will be at a minimum clipping level.

When volume control 414 is advanced such that the volume is 12 dB beyond this minimum clipping level, microcomputer 418 switches filter 408 into the active mode wherein the filter assumes a two pole response with a 1.1 KHz corner frequency. If step attenuator 406 were not adjusted when filter 408 is switched to the active mode, a marked decrease in the volume emitted from speaker 412 would be perceptible to the listener. Accordingly, when filter 408 is switched to the active mode, microcomputer 418 commands attenuator 406 to increase the gain by a step of 6 dB. (The particular increase in gain of 6 dB has been determined experimentally by repetitive listener tests.) Thus, a decrease in perceived loudness at speaker 412 that would have been caused by the switching of filter 408 to the active mode, is compensated by a step increase in gain in attenuator 406. Accordingly, the perceived loudness at speaker 412 appears to smoothly and continuously increase as volume control 414 is advanced.

Figure 1:
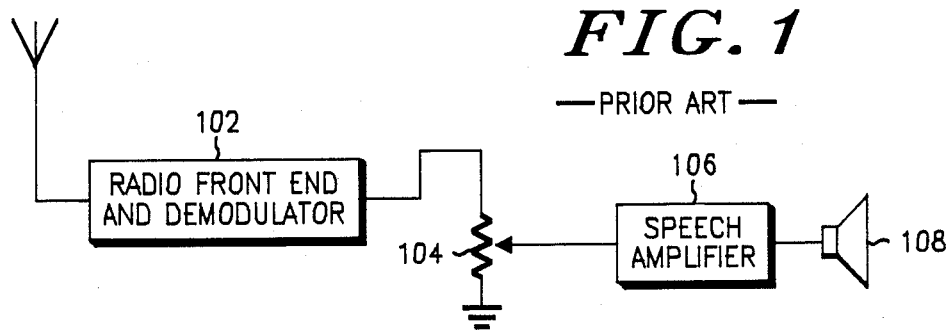
FIG. 1 is a block diagram of a prior art radio receiver.
Figure 2A:
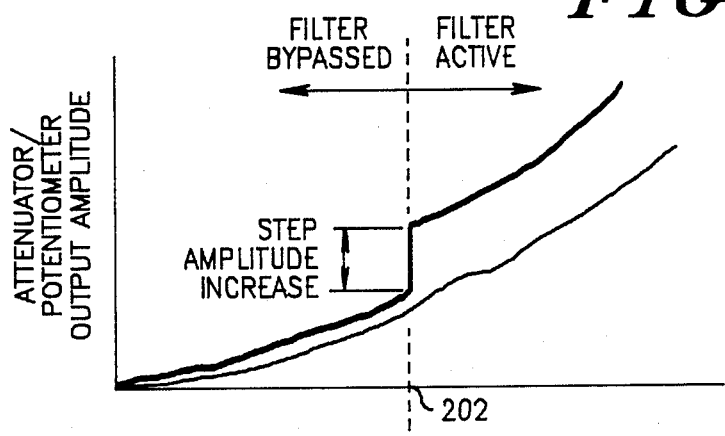
FIG. 2a, b, and c are respectively graphs of attenuator/potentiometer output amplitude, perceived loudness, and amplifier distortion versus the rotation angle of the volume control.

The response of the present invention is illustrated by the thick line in the graphs of FIGS. 2a, b and c. Referring to FIG. 2a, it should be evident that there is a smooth and continuous increase at the output of step attenuator 406 as the volume control is advanced up to point 202. At point 202, speech amplifier 410 is approximately 12 dB beyond the minimum clipping level and high pass filter 408 is switched to the active mode. Simultaneously, microcomputer 418 commands attenuator 406 to step its output voltage by 6 dB. As volume control 414 is advanced beyond point 202, the output of step attenuator 406 again has a smooth and continuously increasing response. The thin line in FIG. 2a illustrates the output of potentiometer 104 of FIG. 1 to provide a direct comparison to the output of step attenuator 406 of the present invention.

Figure 2B:
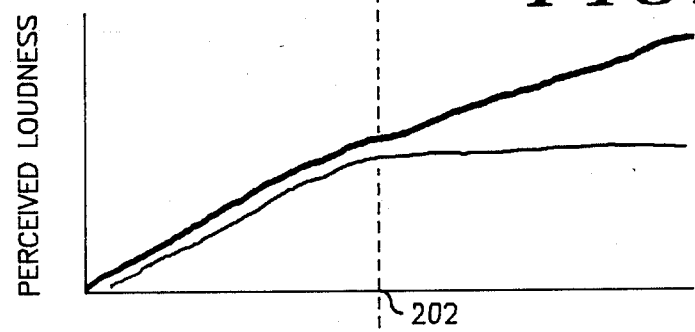
Figure 2C:
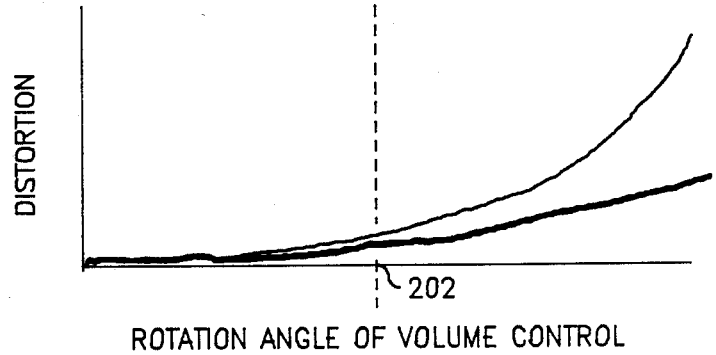

Referring to FIG. 2b, the perceived loudness of the present invention and the prior art circuit are essentially identical up to point 202 (the thick and thin lines have been shown separated in the figure for clarity, but in actuality the curves are essentially identical to the left of point 202). At point 202, the prior art circuit is well into clipping and a further increase in the signal level at the input of speech amplifier 106 does not substantially increase the perceived loudness at speaker 108. In the preferred embodiment, however, filter 408 is switched in at point 202 and the perceived loudness at speaker 412 increases as volume control 414 is advanced beyond point 202. FIG. 2c similarly illustrates that the distortion of the prior art circuit increases rapidly as the volume control is advanced beyond point 202 while the distortion of the present invention increases at a much lower rate.

Figure 3:
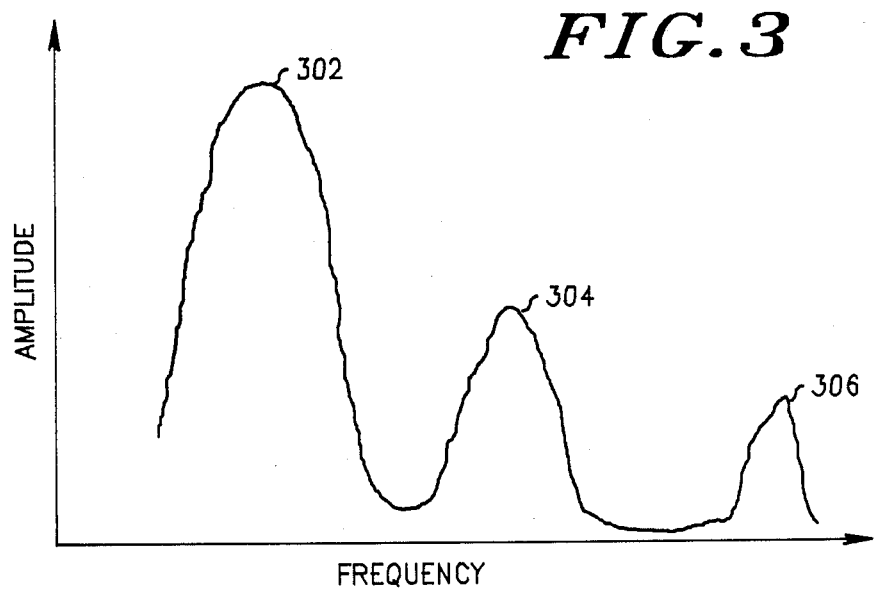
FIG. 3 is a frequency response plot of a typical human voice.

The theory of operation of the present invention is best understood by referring to FIG. 3. In FIG. 3, a frequency response of a typical human voice is illustrated. As previously explained, this response has peaks 302, 304 and 306 which are respectively referred to as first, second and third formants. First formant 302 is primarily responsible for speaker recognition, while second and third formants 304 and 306 are responsible for word and syllable recognition. Because first formant 302 is centered at approximately 700 Hz and second formant 304 is centered at approximately 1500 Hz, the switching of filter 408 to the active mode only attenuates first formant 302. Because second and third formants 304 and 306 are not attenuated by the activation of filter 408, no intelligibility is lost, however, speaker recognition may be degraded slightly.

Accordingly, for a given speech amplifier the invention of FIG. 4 is capable of increasing the perceived loudness at the speaker and, simultaneously, reducing the distortion at higher volumes levels. This circuit is primarily useful in battery operated radio receivers wherein the maximum power capability of the speech amplifier is typically limited to conserve battery charge. Obviously, if an unlimited power source is available an increase in the perceived loudness could be accomplished merely by increasing the maximum power capability of the speech amplifier.

We claim as our invention:

1. A speech amplifier circuit for a battery powered radio receiver, comprising in combination:

variable gain means for varying the amplitude of an electrical speech signal, said variable gain means having a control input for selecting the amplitude of said electrical speech signal;

a high pass filter coupled to said variable gain means, said filter having active and bypass modes and a control input for selecting one of said modes;

a speech amplifier coupled to said filter;

a speaker coupled to said amplifier;

volume selecting means for selecting the volume of speech emitted from said speaker; and controlling means, coupled to said volume selecting means, for controlling said variable gain means and said filter;

whereby, said active mode of said filter is selected by said controlling means when said volume selecting means is advanced to a predetermined level and, simultaneously, said variable gain means is adjusted by said controlling means to have a step increase in the amplitude of said electrical speech signal.

2. The speech amplifier circuit of claim 1, wherein:

said filter has a corner frequency of substantially 1.1 KHz; and said step increase in the amplitude of said electrical speech signal is substantially 6 dB.

* * * * *